United States Patent
Eng et al.

(10) Patent No.: US 6,387,729 B2
(45) Date of Patent: May 14, 2002

(54) METHOD FOR ADHERING AND SEALING A SILICON CHIP IN AN INTEGRATED CIRCUIT PACKAGE

(75) Inventors: Kian Teng Eng; Min Yu Chan; Jing Sua Goh; Siu Waf Low; Boon Pew Chan; Tuck Fook Toh; Chee Kiang Yew; Pak Hong Yee, all of Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/899,193

(22) Filed: Jul. 6, 2001

Related U.S. Application Data

(62) Division of application No. 09/510,605, filed on Feb. 22, 2000, which is a division of application No. 08/994,240, filed on Dec. 19, 1997, now Pat. No. 6,087,203.

(51) Int. Cl.[7] .................. H01L 21/44; H01L 21/48; H01L 21/50
(52) U.S. Cl. .................. 438/106; 438/118; 438/127
(58) Field of Search ................. 438/108, 118, 438/127

(56) References Cited

U.S. PATENT DOCUMENTS

| | | |
|---|---|---|
| 3,179,913 A | 4/1965 | Mittler et al. ............... 339/18 |
| 3,370,203 A | 2/1968 | Kravitz et al. ............. 317/101 |
| 3,459,998 A | 8/1969 | Focarile ..................... 317/100 |
| 3,904,934 A | 9/1975 | Martin ....................... 317/101 |
| 3,999,285 A * | 12/1976 | Lewis et al. |
| 4,126,758 A * | 11/1978 | Krumme |
| 4,288,841 A | 9/1981 | Gogal ......................... 361/414 |
| 4,502,098 A | 2/1985 | Brown et al. .............. 361/383 |
| 4,574,331 A | 3/1986 | Smolley ...................... 361/393 |
| 4,646,128 A | 2/1987 | Carson et al. ................ 357/74 |
| 4,727,410 A | 2/1988 | Higgins, III ................ 357/74 |
| 4,823,233 A | 4/1989 | Brown et al. .............. 361/383 |
| 4,833,568 A | 5/1989 | Berhold ..................... 361/383 |
| 4,862,249 A | 8/1989 | Carlson ........................ 357/80 |
| 4,868,712 A | 9/1989 | Woodman .................... 361/388 |
| 4,953,005 A | 8/1990 | Carlson et al. ................ 357/80 |
| 5,016,138 A | 5/1991 | Woodman .................... 361/381 |
| 5,019,945 A | 5/1991 | Smolley ...................... 361/412 |
| 5,607,883 A * | 3/1997 | Bhattacharyya et al. |
| 5,701,233 A | 12/1997 | Carson et al. ............. 361/735 |
| 5,739,585 A | 4/1998 | Akram et al. ............... 257/698 |
| 5,834,336 A | 11/1998 | Maheshwari et al. ....... 438/124 |
| 5,846,852 A | 12/1998 | Limper-Brenner et al. . 438/125 |
| 5,869,356 A | 2/1999 | Fuller, Jr. et al. ........... 438/124 |

* cited by examiner

*Primary Examiner*—Charles Bowers
*Assistant Examiner*—Josetta I. Jones
(74) *Attorney, Agent, or Firm*—Wade James Brady III; Frederick J. Telecky Jr.

(57) ABSTRACT

A method and apparatus for producing an integrated circuit package (30) comprising a substrate (70) having an opening (86) and first and second surfaces (92, 94), a plurality of routing strips (82) being integral with the substrate (70) and extending into the opening (86), a plurality of pads (100) disposed on the first and second surfaces (92, 94) are electrically connected with at least one of the routing strips (82), wire bonding (80) electrically connecting at least one bonding pad (120) to at least one of the routing strips (82) and a silicon chip (50) attached to the printed circuit board (70) by an adhesive material (60) that provide a seal between silicon chip (50) and printed circuit board (70) is disclosed.

5 Claims, 1 Drawing Sheet

METHOD FOR ADHERING AND SEALING A SILICON CHIP IN AN INTEGRATED CIRCUIT PACKAGE

CROSS REFERENCE TO PRIOR APPLICATIONS

This application is a division of Ser. No. 09/510,605, filed Feb. 22, 2000, which is a division of Ser. No. 08/994,240, filed Dec. 19, 1997, now U.S. Pat. No. 6,087,203.

TECHNICAL FIELD OF THE INVENTION

The present invention relates in general to the field of high frequency integrated circuit packages and more specifically to an apparatus and method of using an adhesive material to attach a silicon chip to a substrate and to provide a protective coverage around the chip.

BACKGROUND OF THE INVENTION

Without limiting the scope of the invention, its background is described in connection with integrated circuit packages, as an example.

Heretofore, in this field, integrated circuits have been formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are packaging related.

The integrated circuit must be packaged in a suitable media that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to a lead frame, where, following wire bonding and encapsulation, designated parts of the lead frame become the terminals of the package. The packaging of integrated circuits has also involved the placement of chips on a flexible board where, following adhesion of the chip to the surface of the flexible board and wire bonding, an encapsulant is placed over the chip and the adjacent flexible board to seal and protect the chip and other components.

Unfortunately, current methods for encapsulating silicon chips have led to various problems, including cracking between the encapsulation material and the integrated circuit components, as well as high failure rates due to the multistep nature of the process. Cracking has plagued the industry because of differences in the coefficient of thermal expansion of the different components, for example, between the soldering materials at the different interfaces and between metallic and non-metallic components. Cracking is also frequent between the silicon wafer and the encapsulation materials, usually epoxies, due to the extreme variations in temperature in various environments and between periods of operation and non-operation.

Even if the encapsulated silicon chip is successfully assembled into a working integrated circuit, another problem is commonly encountered. Once the silicon chip is encapsulated it is typically surface mounted using radiant heat or vapor saturated heating. This process, however, can lead to poor coplanarity due to uneven reflow, leading to integrated circuit failure.

Therefore, a need has arisen for an integrated circuit package and a process for producing an integrated circuit package wherein a single material may be used to adhere the chip to the flexible board and protect the chip during subsequent manufacturing and testing steps as well as from the environment of its intended purpose. A need has also arisen for a smaller, more versatile integrate circuit package made from materials and by methods that lead to increased yield by more closely matching the coefficient of thermal expansion of the materials used in the package.

SUMMARY OF THE INVENTION

The present invention disclosed herein comprises an integrated circuit package and a process for producing an integrated circuit package that protects the silicon chip during manufacturing and testing steps and from the environment of its intended purpose using the same material that adheres the silicon chip to the printed circuit board.

The integrated circuit package is produced by placing an adhesive material on one surface of a substrate then placing a chip in contact with the adhesive material such that the chip is adhered to the substrate by the adhesive material and such that a seal is provided around the perimeter of said chip by the adhesive material to protect said chip.

The substrate has an opening and first and second surfaces. A plurality of routing strips are integral with the substrate and extend into the opening. A plurality of pads are disposed on the first surface, at least one of the pads is electrically connected with at least one of the routing strips. The chip has at least one bonding pad. Wire bonding electrically connecting the bonding pad to at least one of the routing strips. Potting material fills the opening. At least one solder ball is attachd to at least one of the pads disposed on the first surface.

The process of attaching the chip to the substrate also includes positioning the chip in contact with the adhesive layer, placing the chip on a mounting stage, applying heat to the chip, applying a force to the chip, and flowing the adhesive around the perimeter of the chip. In one embodiment of the present invention the temperature applied to the chip is between about 200° C. and 250° C. and may preferably be about 220° C. In one embodiment of the present invention the force applied to the chip may be between about 150 and 200 grams and preferably about 175 grams. The force may be applied for between about 2 and 10 seconds and preferably for about 5 seconds.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is related to high frequency integrated circuits using a board-on-chip design that enables a reduction in processing steps during the production of integrated circuit packages. In addition to the improved processing method, the present invention meets the space constraint requirements of modern semiconductors. The principles of the present invention may be incorporated into, for example, a synchronous DRAM (SDRAM) silicon chip. However, the present invention is also applicable to LOGIC, SRAM, EPROM and any other integrated circuit components.

Figure 1:
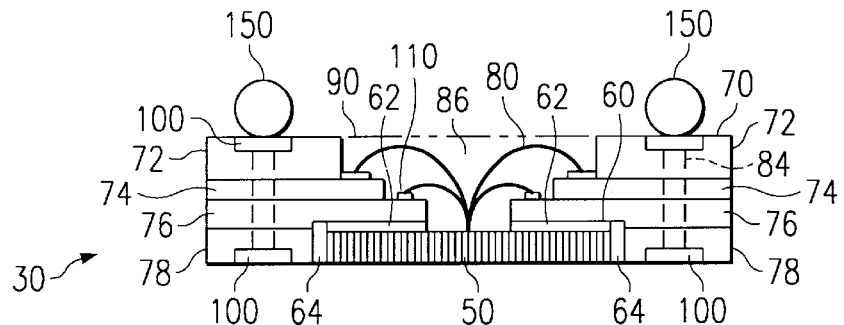
FIG. 1 is a simplified end cross-sectional view of an integrated circuit package of the present invention.

FIG. 1 is a simplified cross-sectional view of an integrated circuit package that is generally designated 30. The integrated circuit package 30 comprises a silicon chip 50, which can be, for example, any integrated circuit component such as a DRAM, an EPROM, a SRAM or a LOGIC chip. A printed circuit board 70 is attached to the silicon chip 50 by an adhesive material 60 that forms an adhesive layer 62 between the printed circuit board 70 and the silicon chip 50 and an adhesive seal 64 around the silicon chip 50 to protect silicon chip 50 from, for example, moisture. The adhesive material 60 may be, for example, an adhesive glue or epoxy. The printed circuit board 70 consists of four layers, a top layer 72, an intermediate layer 74, an intermediate layer 76, and a bottom layer 78.

The printed circuit board 70 may be constructed from a material such as FR-4 which is available from, for example, Motorola Inc., U.S.A. FR-4 is an epoxy resin reinforced with a woven glass cloth. In selecting the material for printed circuit board 70, one skilled in the art will recognize that four parameters should be considered, namely, thickness, dielectric constant, glass transition temperature and the coefficient of thermal expansion.

Thickness is dependant on the number of layers required and the amount of reinforcement used in a given layer. The reinforcing glass cloth can range in thickness from, for example, 2 mil per sheet (type 106) to about 8 mil per sheet (type 7628). Dielectric constant is determined by a combination of the resin used and the thickness and type of reinforcement used. Standard FR-4 has a dielectric constant of about 4.5. This constant can be reduced to about 3 by replacing the epoxy resin with a cyanate ester resin. The greater the thickness, however, the greater the problems associated with thickness control, rough surfaces, excessive drill reflection and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for printed circuit boards having a $T_g$ above 250° C.

The coefficient of thermal expansion for FR-4 is about 16 ppm/° C. A difference in the coefficient of thermal expansion between the printed circuit board 70 made from FR-4 and the silicon chip 50 can lead to failure of the integrated circuit package 30 during, not only the assembly of the integrated circuit package 30, but also during the use of integrated circuit package 30.

The adhesive material 60 may be Hitachi HM122u. Alternatively, the silicon chip 50 can be adhered to the printed circuit board 70 with a die bonding film such as HIATTACH-335 (DF-335) manufactured by Hitachi Chemical Company of Tokyo, Japan. HIATTACH-335 (DF-335) is silver filled thermosetting type resin film for die-attaching.

DF-335 has the following properties

| Test | Remarks | Units | DF-335 |
| --- | --- | --- | --- |
| Appearance | Visual | — | silver film |
| Solid Content | 200° C. - 2 h | wt % | ≧96 |
| Ash Content | 600° C. - 1.5 h | wt % | 40 |
| Ash Content/Solid | 600° C. - 1.5 h | wt %/solid | 42 |
| Thickness | Dial gauge | μm | 25 |
| Tensile Strength | R.T. | kgf/mm² | 7.1 |
| Tensile Modulus | R.T. | kgf/mm² | 271 |
| Die shear strength | 4 × 4 mm chip/Ag plated alloy 42 | kgf/chip | |
| R.T. | | | ≧10 |
| 250° C. | | | 0.9 |
| Peel strength 240° C. (after/ 85° C. 85%, 48 h) | 8 × 8 mm chip/bare alloy 42 | kgf/chip | ≧3.0 |
| Tg | TMA, 180° C. - 1 h cured | ° C. | 123 |
| Modulus | Viscoelastic spectrometer | Mpa | 1300 |
| Moisture | 85° C./85% RH, 48 h | wt % | 0.1 |

Other examples of adhesives include thermosetting adhesives, such as epoxies, polyimides and silicone. Thermoplastic adhesives that are hot-melted, in the form of sheets or as a pressure sensitive adhesive tape may also be used to adhere silicon chip 50 to the printed circuit board 70. Commonly used are adhesive tapes based on elastomers, silicones or acrylics because of their ease of use and easy incorporation into production.

Figure 2:
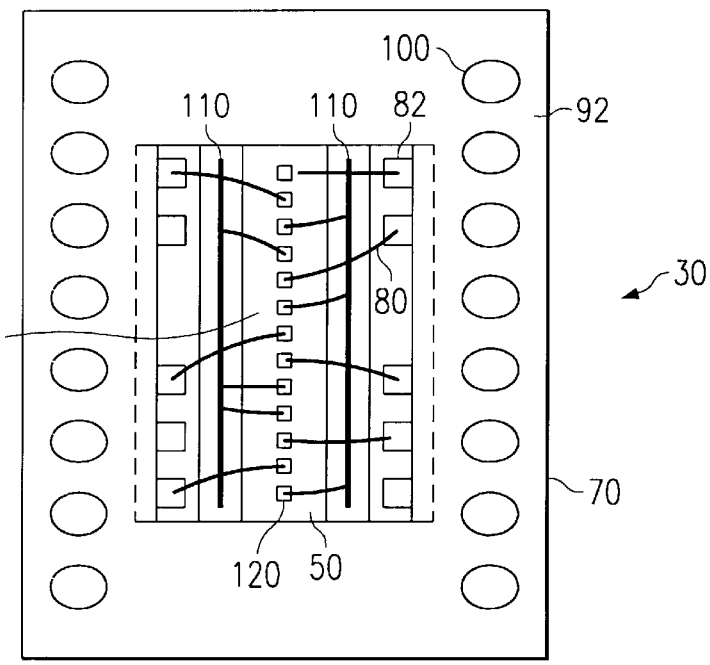
FIG. 2 is a simplified top view of an integrated circuit package of the present invention.

Referring collectively to FIGS. 1 and 2, intermediate layer 74 has routing strips 82 that are electrically connected through vias 84 to pads 100 located on top surface 92 of top layer 72 and bottom surface 94 of bottom layer 78. It should be understood by one skilled in the art that the terms "top" and "bottom" as well as the terms "side" and "end" are used for illustration purposes only, as the integrated circuit package 30 of the present invention can be assembled and used in a variety of positions and ways. Intermediate layer 76 includes a pair of bus bars 110. The bus bars are electrically connected through vias 84 to one or more of the pads 100. The bus bars 110 may serve, for example, as power supplies or grounds, and it is preferred that one bus bar 110 serve one function, such as a power supply, and the second bus bar 110 serve another function, such as a ground.

The silicon chip 50 has bonding pads 120 located generally in the central area of silicon chip 50. The bonding pads 120 are connected to routing strips 82 and bus bars 110 by wire bonding 80.

Even though FIG. 1 depicts printed circuit board 70 as having four layers 72, 74, 76 and 78, it should be understood by one skilled in the art that printed circuit board 70 may consist of a single layer or may be a multi-layered board having an alternate number of layers.

The above described components and their constructions and interrelation provide an assembly that is encapsulated as described below. The term "assembly" refers to the assembled components prior to encapsulation. The assembly consists of printed circuit board 70, adhered silicon chip 50 and wire bonding 80. The printed circuit board 70 has a top opening 86 and a cavity 88 with routing strips 82 and bus bars 110 extending into the top opening 86. The top opening 86 and the cavity 88 are open with respect to one another. Disposed on pads 100 are solder balls 150.

The wire bonding 80 process begins before silicon chip 50 has been adhered to printed circuit board 70. Silicon chip 50 and printed circuit board 70 are then positioned on a heated pedestal to raise the temperature of the combination to a point between 100°–300° C. A gold wire having a diameter typically ranging from 0.7 mil. to 1.3 mil. is strung through a heated capillary where the temperature may range between 200°–500° C. A soldering ball is created at the end of the wire using either a flame or a spark technique. This soldering ball is then brought to bonding pad 120 on the silicon chip 50 and a combination of compression force and ultrasonic energy are used to create the desired metallurgical bond. Using this "stitch" technique significantly reduces the cross-section of the wire at that point. A loop is created in the wire bonding 80 above the bond that has just been achieved, and the wire bonding 80 is routed to the desired connection on the printed circuit board 70 such as routing strip 82 or bus bar 110. The wire bonding 80 is clamped and the capillary raised, such that the wire bonding 80 will break free at the outer edge of the bond. This process is repeated until all the bonding pads 120 that require electrical connection on the silicon chip 50 are electrically connected to printed circuit board 70.

Following the assembly of the above-described components, the opening 86 is filled with potting material 90 as represented by the dashed line above opening 86.

The potting material 90 may be a cyanate ester-type resin available from Shin-Etsu Chemical Co., Ltd., such as KMC 184VA and KMC 188VA-4. Other examples of potting materials 90 that may be used with the present invention include epoxies, polyesters, polyimides, cyanoacrylates, ceramic, silicone and urethane. The potting materials 90 may also contain fillers that affect the coefficient of thermal expansion, as well as the strength and flexibility of the potting material 90. The selection of potting material 90 and fillers will depend on the components used to make the integrated circuit package 30, as will be known to those of skill in the art.

Properties of Typical Potting Resins

|  | Epoxy | Polyester | Silicone | Urethane |
|---|---|---|---|---|
| Dielectric constant, D-150 |  |  |  |  |
| 60 Hz | 3.9 | 4.7 | 2.7 | 5.7 |
| $10^6$ Hz | 3.2 | — | 2.7 | 3.4 |
| Dissipation factor, D-150 |  |  |  |  |
| 60 Hz | 0.04 | 0.017 | 0.001 | 0.123 |
| $10^6$ Hz | 0.03 | — | 0.001 | 0.03 |
| Dielectric strength, D-149; V/mil | 450 | 325 | 550 | 400 |
| Volume resistivity, D-257; $\Omega \cdot$ cm | $10^{15}$ | $10^{14}$ | $10^{15}$ | $10^{13}$ |
| Arc resistance, D-495; seconds | 150 | 135 | 120 | 180 |
| Specific gravity, D-792 | 1.15 | 1.2 | 1.05 | 1.0 |
| Water absorption, D-570; % 24 h | 0.15 | 0.3 | 0.12 | 0.4 |
| Heat deflection temperature, D-648; at 264 lb/in$^2$, °F. | 380 | 260 | <70 | <70 |
| Tensile strength, D-638; lb/in$^2$ | 29000 | 10,000 | 1000 | 2000 |
| Impact strength (Izod), D-256; ft · lb/in | 0.5 | 0.3 | No break | No break |
| Coefficient of thermal expansion, D-969; $10^{-5}$/° F. | 5.5 | 7.5 | 4.0 | 15 |
| Thermal conductivity, C-177; Btu · in/ (h · ft$^2$ · ° F. | 1.7 | 1.7 | 1.5 | 1.5 |
| Linear shrinkage; % | 0.3 | 3.0 | 0.4 | 2.0 |
| Elongation, D-638; % | 3 | 3 | 175 | 300 |

The solder balls 150 used with the present invention may be attached to the pads 100 using conventional solder reflow systems. For example, a vapor phase solder reflow system may be used, which condenses vapor to surround the integrated circuit package 30 and the printed circuit board 70 with a cloud of steam. A liquid, such as a nonchlorinated (non CFC) fluorocarbon is first heated with enough energy to form a vapor and to sustain a vapor cloud. When the integrated circuit package 30 is then passed through the vapor, the vaporized liquid condenses thereon and gives off the latent heat of vaporization. This energy is then transferred to the integrated circuit package 30. As long as the integrated circuit package 30 remains in the vapor, the vapor continues to give off energy at a repeatable fixed rate and temperature, until the integrated circuit package 30 reaches the temperature of the vapor. The advantage of using a nonchlorinated fluorocarbon is that it is extremely thermally stable, colorless, odorless and nonflammable. In addition, it has a low toxicity, low surface temperature, low boiling point-, and low heat of vaporization. Because the fluid form of the non-chlorinated fluorocarbon is inert, it does not react with fluxes or component materials, nor does it absorb oxygen or other gases that cause reactions during the solder reflow. Most commercially available fluorocarbons used for vapor phase reflow are formulated to vaporize at precisely stable reflow temperatures for different solder materials, as will be known to those skilled in the art.

The vaporization temperature will depend on the solder type being used. A brief temperature profile for the non-chlorinated flucrocarbons that are used as vapor fluids is shown below.

Vaporization Temperatures and Solder Types

| Fluid Temperature | Solder Type |
|---|---|
| 56, 80, 97, 101, 102° C. and 155° C. | 100 In |
|  | 37 Sn/38 Pb/25 In |
| 165° C. | 70 Sn/18 Pn/12 In |
|  | 70 In/30 Pb |
| 174° C. | 60 In/40 Pb |
| 190° C. | 90 In/10 Ag |
|  | 50 In/50 Pb |
|  | 63 Sn/37 Pb |
|  | 70 Sn/30 Pb |

-continued

| Fluid Temperature | Solder Type |
|---|---|
|  | 60 Sn/40 Pb |
| 215° C. and 230° C. | 60 Sn/40 In |
|  | 60 Sn/40 Pb |
|  | 63 Sn/37 Pb |
|  | 70 Sn/30 Pb |
|  | 62 Sn/36 Pb/2 Ag |
| 240 ° C. and 253° C. | 75 Pb/25 In |
|  | 81 Pb/19 In |
| 260° C. and 265° C. | 96.5 Sn/3.5 Ag |

Alternatively, infrared or radiant heated solder reflow may be used. In such a system each component of the soldering system is directly exposed to radiation from a heating element. Heat from the radiant energy element is absorbed by the different components according to its molecular structure.

Conventional radiant heat systems expose only the outer surfaces of the components to the radiant heat, which may not reach interior areas as efficiently as with vapor saturated heating methods as described above. The present invention, however, is not affected by this typical problem because of the use of solder balls 150 instead of leads. In fact, due to the reduced overall size either method, vapor phase solder reflow or radiant heated solder reflow, may be effectively used with the present invention.

The present invention also solves other problems associated with solder reflow systems. These problems include the creation or failure due to voids, coplanarity, tombstoning, open joints, component cracking, thermal shock and thermal stressing. The present invention solves these problems because it dispenses with the need for electrically connecting soldering leads to the integrated circuit package 30. By using solder balls 150 instead of leads, the problems associated with voids around pad areas or under leads caused by incomplete reflow or poor welding of the soldering surface due to improper flux or badly oxidized surfaces is eliminated. The problems of coplanarity and tombstoning are also reduced or eliminated using the solder balls 150 because surface tension on both sides of the solder balls 150 is equal.

Open joints are usually caused by problems with coplanarity, while cracking may occur when trapped moisture within an integrated circuit package expands as the device is heated for reflow. The increase in internal pressure, causes the integrated circuit package to split open, usually at one of the corners. The splitting of the package causes wire bonding from the lead frame to the silicon chip to break and in some cases the silicon chips have cracked due to the warpage at the top of the package as the temperature differentials between the top and the bottom of the device cause different rates of expansion.

Using the present invention, the only surface temperature differential that occurs is between the solder ball 150 and the printed circuit board 70, which allows either vapor phase solder reflow or radiant heat solder reflow to be available for producing the present invention. The small size of the solder balls 150, and of the integrated circuit package 130 as a whole, allows for any of the reflow systems to be used with the because the temperature differential between the components is almost negligible. Furthermore, by selecting an adhesive material 90 having a coefficient of thermal expansion similar, or equal to, the coefficient of thermal expansion of the other components of the integrated circuit package 30, heat reflow effects and problems can be minimized.

Although the board-on-chip layout of integrated circuit package 30 as depicted in FIGS. 1 and 2 has been described using centralized bonding pads 120, it should be understood by one skilled in the art that the principles of the present invention are applicable to a silicon chip 50 with bonding pads 120 in alternate layouts such as positioned along the sides of the silicon chip 50.

Also, it should be noted by one skilled in the art that pads 100 and bus bars 110 may be located on a single layer of printed circuit board 70. Generally, a layer of insulated tape or coating may be placed on the bus bars 110 to provide for electrical isolation. The advantage of a multi-layer printed circuit board 70, however, is the elimination of the need to insulate the bus bars 110. Additionally, the multi-layer printed circuit board 70 provides a greater process margin for wire bonding.

Figure 3:
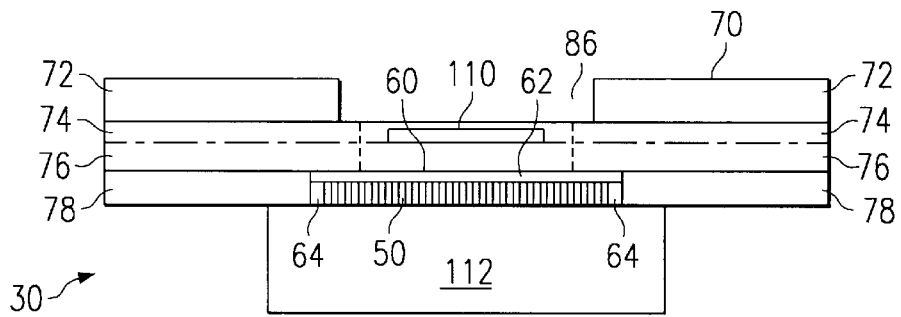
FIG. 3 is a simplified side cross-sectional view of an integrated circuit package of the present invention in combination with a heated mounting stage.

FIG. 3 is a simplified side cross-sectional view of integrated circuit package 30. The integrated circuit package 30 comprises a silicon chip 50 and a printed circuit board 70 that is attached to the silicon chip 50 by an adhesive material 60. The printed circuit board 70 consists of four layers, a top layer 72, an intermediate layer 74, an intermediate layer 76, and a bottom layer 78. The printed circuit board 70 has a top opening 86.

The process for bonding silicon chip 50 to printed circuit board 70 involves attaching an adhesive film on printed circuit board 70 at 160° C. for five seconds with an applied force of 1,000–3,000 grams. The silicon chip 50 is then placed on the film and the combination of the printed circuit board 70 and the silicon chip 50 is placed on a heated mounting stage 112. Heated mounting stage 112 is at a temperature of 220° C. and applies a force of about 150–200 grams for five seconds allowing adhesive material 60 to flow into the areas between silicon chip 50 and bottom layer 78 to form an adhesive seal 64 and an adhesive layer 62 around silicon chip 50.

The present invention may use a double sided integrated. circuit package 30 to achieve an overall reduction in height. It also allows for decreased failure due to the reduced number of soldered materials having varying coefficients of thermal expansion. The present invention further reduces the overall number of steps in the assembly of, for example, memory units by streamlining the assembly process not only in reduced number of steps, but also by elimination the curing steps associated with capsulating integrated circuit. The present invention further reduces the amount of material used in producing integrated circuit packages 30, thereby saving time, money and the environment.

Furthermore, the method of the present invention takes advantage of the top opening 86 at the center of the printed circuit board 70 for "potting" the wire bonding 80 that connect the silicon chip 50 and the printed circuit board 70 in a single step. By filling the opening 86 with an adhesive material 90 to create an adhesive layer 60, the wire bonding 80 between silicon chip 50 and the printed circuit board 70 are generally protected from the environment and are particularly protected from moisture due to the hermetic nature of the encapsulation.

The method of adhering the silicon chip 50 to the printed circuit board 70 of the present invention provides protection for silicon chip 50 by hermetically sealing silicon chip 50 from the environment A reduce profile is also achieved by allowing the non-operative or backside of the silicon chip 50 to be exposed. By hermetically protecting the connections between the silicon chip 50 and the printed circuit board 70 at the top opening 86, there is no need to completely encapsulate the entire assembly.

The present invention also reduces the overall number of steps in the assembly of, for example, memory units by streamlining the assembly process not only in reduced number of steps, but also by elimination the curing steps associated with encapsulating integrated circuit. The present invention further reduces the amount of material used in producing integrated circuit packages 30, thereby saving time, money and the environment.

The problems of coplanarity are eliminated by using solder balls 150 to attach the integrated circuit package 30 to another printed circuit board, such as a mother board, because there are no leads that may bend and there are no deviations from the plane of the motherboard to which the module is being connected.

Additionally, reduced environmental impact is obtained using the method and apparatus of the present invention due to the overall decrease in the size of the integrated circuit package 30.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A process for fabricating an integrated circuit package comprising the steps of:

providing a substrate having an opening extending therethrough to a pair of opposing surfaces of said substrate;

placing a chip having a pair of opposing major surfaces and a perimeter within said opening in contact with said adhesive material, said chip having a least one bonding pad extending into said opening;

extending a plurality of routing strips within said substrate to said opening;

disposing a plurality of pads on a said surface of said substrate;

electrically connecting at least one of said pads with at least one of said routing strips;

electrically connecting said routing strips to said at least one bonding pad on said chip with wire bonding;

disposing an adhesive material on said substrate and within said opening opposed to said chip;

adhering said chip to said substrate with said adhesive material within said opening; and then heating said chip and said adhesive material to provide an hermetic seal around the perimeter of said chip with said adhesive material to protect said chip; and filling said opening with a potting material.

2. A process for fabricating an integrated circuit package comprising :

providing a substrate having an opening extending therethrough to a pair of opposing surfaces of said substrate;

placing a chip having a pair of opposing major surfaces and a perimeter within said opening in contact with said adhesive material, said chip having a least one bonding pad extending into said opening;

extending a plurality of routing strips within said substrate to said opening;

disposing a plurality of pads on a said surface of said substrate;

electrically connecting at least one of said pads with at least one of said routing strips;

electrically connecting said routing strips to said at least one bonding pad on said chip with wire bonding;

disposing an adhesive material on said substrate and within said opening opposed to said chip;

adhering said chip to said substrate with said adhesive material within said opening; and heating said chip and said adhesive material to provide an hermetic seal around the perimeter of said chip with said adhesive to protect said chip; and filling said opening with a potting material;

further including the steps of:

disposing at least one bus bar on said substrate;

electrically connecting said at least one bus bar with at least one of said bonding pads with wire bonding; and electrically connecting said at least one bus bar with at least one of said pads disposed on said first surface.

3. The process as recited in claim 1 further comprising the step of attaching at least one solder ball to at least one of said pads disposed on said first surface.

4. The process as recited in claim 1 wherein the step of adhering said chip to said substrate with said adhesive material further includes placing said chip on a mounting stage, applying heat to said chip and applying a force to said chip.

5. The process as recited in claim 4 wherein the step of providing a seal around the perimeter of said chip with said adhesive material further includes flowing said adhesive around the perimeter of said chip.

* * * * *